(12) United States Patent
Griffin et al.

(10) Patent No.: US 7,384,066 B2
(45) Date of Patent: Jun. 10, 2008

(54) SYNCHRONOUS DEMODULATION WITH PRECISION TRACK-AND-HOLD CIRCUIT

(75) Inventors: Dennis P. Griffin, Noblesville, IN (US); George J. Noland, Noblesville, IN (US); William W. Fultz, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 769 days.

(21) Appl. No.: 10/986,235

(22) Filed: Nov. 11, 2004

(65) Prior Publication Data

US 2006/0097780 A1    May 11, 2006

(51) Int. Cl.
*B60R 21/16* (2006.01)

(52) U.S. Cl. ..................................................... 280/735

(58) Field of Classification Search ................. 180/271, 180/273, 274; 280/728.1, 734, 735; 307/10.1; 340/425.5, 436, 438, 500, 540
See application file for complete search history.

(56) References Cited

U.S. PATENT DOCUMENTS 6,298,311 B1 * 10/2001 Griffin et al. ................ 702/150

\* cited by examiner

*Primary Examiner*—David Mis
(74) *Attorney, Agent, or Firm*—Jimmy Funke

(57) ABSTRACT

A synchronous demodulation circuit uses a digitally controlled track-and-hold circuit to capture the peak amplitude of a rectified signal. A microcontroller controls the track-and-hold circuit. In particular, the microcontroller controls a hold mode of the track-and-hold circuit to capture the peak amplitude of the rectified signal.

32 Claims, 2 Drawing Sheets

SYNCHRONOUS DEMODULATION WITH PRECISION TRACK-AND-HOLD CIRCUIT

TECHNICAL FIELD

This disclosure relates generally to signal processing. More particularly, this disclosure relates to signal demodulation circuitry.

BACKGROUND OF THE DISCLOSURE

Airbags have helped save thousands of lives and have helped reduce the number of serious injuries from collisions. In a vehicle equipped with airbags, crash sensors detect an impact. If the impact is sufficiently severe, the airbags are deployed to fill the space between the vehicle interior and the occupant. In this way, the velocity with which the occupant interacts with the vehicle interior is reduced, thereby helping to protect the head and torso of the occupant. In some rare circumstances, however, a vehicle occupant can be injured or even killed by an airbag. For example, if an occupant is not properly positioned, the airbag can cause serious injury or death. Improper positioning can occur with small passengers, such as infants or children. In addition, improper positioning can occur when a passenger is not wearing a seat belt.

To reduce the incidence of airbag-related injuries and deaths, some airbag deployment systems use occupant detection systems to identify whether an occupant is too small for safe airbag deployment. New standards from the National Highway Transportation Safety Administration (NHTSA) require all United States automakers to begin implementing occupant detection systems by 2004. All new vehicles sold in the United States during and after the 2006 model year must be equipped with occupant protection safety features.

Occupant detection systems employ sensors that generate sensor signals. These sensor signals are typically modulated as a function of the occurrence or non-occurrence of an event to be detected. For example, an occupant detection system may incorporate an infrared or other sensor that generates a sensor signal that is modulated as a function of whether a person is within a specified range of the sensor. The occupant detection system then demodulates the sensor signal to identify the presence of an occupant. In some occupant detection systems, the sensor signal may indicate certain properties of the detected occupant, such as weight. Such additional information can be used to inform a decision of whether to enable or disable an airbag deployment system. For example, one type of passive occupant detection system uses a pressure sensor, an electronic control unit, and a seat belt tension sensor to characterize the occupied status of the passenger seat. The data supplied by the sensors is used to classify the occupant, if any, of the passenger seat as an adult or a child or infant. The electronic control unit then communicates to an airbag control system to allow or inhibit passenger airbag deployment.

Some conventional occupant detection systems demodulate sensor signals using an analog synchronous demodulator circuit. In one conventional system, for example, sensor signals are subjected to initial conditioning, including bandpass filtering, amplification, AC coupling, and DC referencing. The conditioned sensor signals are provided to analog peak follower circuits. The peak follower circuits are digitally controlled to enable them to capture the peak amplitudes of the sensor signals. The captured peak signals are further conditioned by difference amplifiers to remove the DC reference. The conditioned peak signals are then amplified and converted to digital signals by an analog-to-digital converter (ADC).

To promote safety, the demodulator circuit should accurately detect peak amplitudes of sensor signals. Failure to accurately detect these peak amplitudes may cause false positives or false negatives. In airbag deployment systems, these errors may cause an airbag to be inappropriately deployed or inappropriately inhibited. For example, if the occupant detection system falsely classifies an adult passenger as a child, the airbag may fail to deploy in the event of a crash. Conversely, if the occupant detection system falsely classifies a child passenger as an adult, the airbag may deploy when such deployment may be hazardous to the child passenger.

In an analog synchronous demodulator circuit, the accuracy of the peak detection depends on the bandwidth of the amplifiers. Using amplifiers with a wide bandwidth may improve the accuracy of the analog synchronous demodulator. Such amplifiers are relatively expensive, however.

SUMMARY OF VARIOUS EMBODIMENTS

According to various example embodiments, a synchronous demodulation circuit uses a digitally controlled track-and-hold circuit to capture the peak amplitude of a rectified signal. A microcontroller (MCU) controls the track-and-hold circuit. In particular, the MCU controls a hold mode of the track-and-hold circuit to capture the peak amplitude of the rectified signal One embodiment is directed to a synchronous demodulation circuit arrangement that includes a sensor interface circuit coupled to receive a sensor signal. The sensor interface circuit is associated with a propagation delay. A microcontroller is configured to generate a microcontroller timing signal and to adjust timing of the microcontroller timing signal as a function of the propagation delay. A track-and-hold circuit arrangement is coupled to receive the sensor signal and is responsive to the microcontroller timing signal. The track-and-hold circuit arrangement is configured to periodically sample the sensor signal. The microcontroller is configured to detect a peak amplitude of the sensor signal and generate a hold control signal in response to the detected peak amplitude. The track-and-hold circuit arrangement is configured to output a peak indication signal in response to the hold control signal.

In another embodiment, an occupant detection system includes a sensor configured to generate a sensor signal in response to sensing a vehicle occupant. A sensor interface circuit is coupled to receive the sensor signal. The sensor interface circuit is associated with a propagation delay. A microcontroller is configured to generate a microcontroller timing signal and to adjust timing of the microcontroller timing signal as a function of the propagation delay. A track-and-hold circuit arrangement is coupled to receive the sensor signal and is responsive to the microcontroller timing signal. The track-and-hold circuit arrangement is configured to periodically sample the sensor signal. The microcontroller is configured to detect a peak amplitude of the sensor signal and generate a hold control signal in response to the detected peak amplitude. The track-and-hold circuit arrangement is configured to output a peak indication signal in response to the hold control signal.

Still another embodiment is directed to a synchronous demodulation method. A microcontroller is synchronized to a drive signal at least in part by detecting an edge of the drive signal. A microcontroller timing signal is adjusted as a function of a propagation delay of the interface circuit. A peak amplitude of the signal received via the interface circuit is detected. In response to this detection, a hold control signal is generated as a function of the adjusted microcontroller timing signal. A peak indication signal is generated in response to the hold control signal. This method may be embodied in a processor-readable medium storing processor-executable instructions.

In another embodiment, a vehicle occupant is detected by generating a sensor signal in response to sensing the vehicle occupant. The sensor signal is provided to a demodulation circuit arrangement via an interface circuit. A microcontroller is synchronized to a sensor drive signal at least in part by detecting an edge of the sensor drive signal. A microcontroller timing signal is adjusted as a function of a propagation delay of the interface circuit. A peak amplitude of the sensor signal is detected. In response to this detection, a hold control signal is generated as a function of the adjusted microcontroller timing signal. A peak indication signal is generated in response to the hold control signal.

Various embodiments may provide certain advantages. For instance, the number of components needed to implement synchronous demodulation may be reduced, thereby reducing costs. In addition, the accuracy of the peak detection may be enhanced through digital control by the MCU.

Additional objects, advantages, and features will become apparent from the following description and the claims that follow, considered in conjunction with the accompanying drawings.

DESCRIPTION OF VARIOUS EMBODIMENTS

A synchronous demodulation circuit uses a digitally controlled track-and-hold circuit to capture the peak amplitude of a rectified signal. A microcontroller (MCU) controls the track-and-hold circuit. In particular, the MCU controls a hold mode of the track-and-hold circuit to capture the peak amplitude of the rectified signal. In this way, the number of components needed to implement synchronous demodulation may be reduced, thereby reducing costs. Moreover, the accuracy of the peak detection may be enhanced through digital control by the MCU.

In the following description, numerous specific details are set forth in order to provide a thorough understanding of various embodiments of the present invention. It will be apparent to one skilled in the art that the present invention may be practiced without some or all of these specific details. In other instances, well known components and process steps have not been described in detail in order to avoid unnecessarily obscuring the present invention.

Some embodiments may be described in the general context of microcontroller-executable instructions, such as program modules, being stored in a microcontroller-readable medium, such as a memory, and executed by a microcontroller (MCU). Generally, program modules include routines, programs, objects, components, data structures, etc., that perform particular tasks or implement particular abstract data types.

Figure 1:
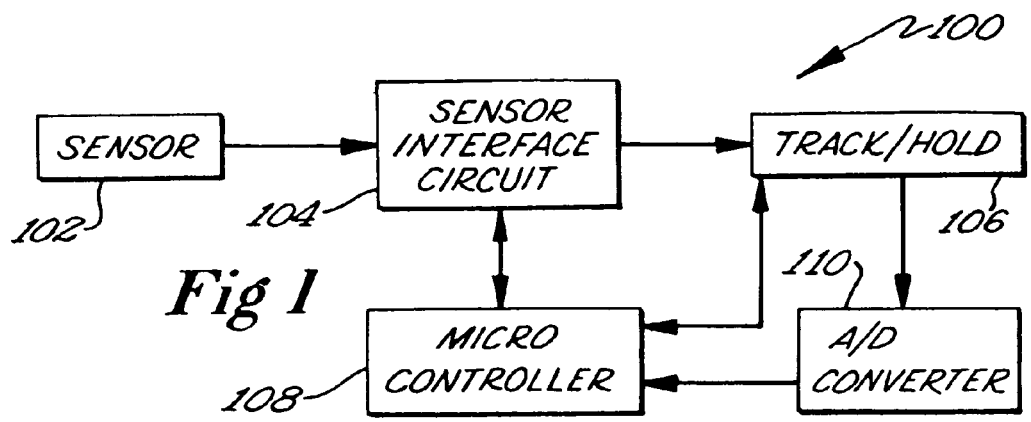
FIG. 1 is a block diagram illustrating an example occupant detection system according to an embodiment.

Referring now to the drawings, FIG. 1 is a block diagram illustrating an example occupant detection system 100. The occupant detection system 100 includes a sensor 102 for detecting a vehicle occupant. The sensor 102 may be implemented using any of a variety of conventional sensors, including, but not limited to, infrared sensors, linear variable differential transformers, optical sensors, ultrasonic sensors, and pressure sensors. The sensor 102 is associated with a sensor drive signal, which is a clock signal. The sensor 102 generates a sensor output signal that indicates whether an object, such as a vehicle occupant, has been detected by the sensor. In the case of an infrared sensor, for example, the sensor 102 generates a sensor output signal indicative of a reflected infrared signal from a remote target. When no occupant is present, the reflected infrared signal is consistent with the distance from the sensor 102 to the seat. When an occupant is present, on the other hand, the reflected infrared signal is consistent with the distance from the sensor 102 to the occupant, which is shorter than the distance from the sensor 102 to the seat.

A sensor interface circuit 104 receives the sensor output signal from the sensor 102. The sensor interface circuit 104 includes a number of electronic components for conditioning the sensor output signal. For example, the sensor interface circuit 104 may include an input bandpass filter to remove high- and low-frequency noise components from the sensor output signal. Additionally, the sensor interface circuit 104 may include a rectifier and an amplifier. While not required, in certain embodiments, the sensor interface circuit 104 may incorporate additional components. The sensor interface circuit 104 outputs a conditioned sensor output signal that is suitable for processing by the occupant detection system 100. As is well-known in the art, the electronic components of the sensor interface circuit 104 are typically associated with individual propagation delays. Accordingly, the sensor interface circuit 104 as a whole is associated with a propagation delay. That is, there is a delay between receiving the sensor output signal from the sensor 102 and providing the output conditioned sensor output signal. In demodulating the conditioned sensor output signal, the occupant detection system 100 compensates for this propagation delay as described in greater detail below.

A track-and-hold circuit arrangement 106 periodically samples the conditioned sensor output signal from the sensor interface circuit 104. The track-and-hold circuit arrangement 106 outputs a peak indication signal that tracks the conditioned sensor output signal until a peak in the conditioned sensor output signal is detected. When a peak is detected, the amplitude of the peak indication signal generated by the track-and-hold circuit arrangement 106 remains substantially equal to the detected peak amplitude. The amplitude of the peak indication signal remains at this level for a certain duration before again tracking the conditioned sensor output signal.

A microcontroller 108 controls the operation of the track-and-hold circuit arrangement 106. In particular, the microcontroller 108 places the track-and-hold circuit arrangement 106 in a hold mode so as to capture the conditioned sensor output signal amplitude when it is near its peak value. The track-and-hold circuit arrangement 106 samples the conditioned sensor output signal and indicates the amplitude of the samples to the microcontroller 108. Shortly after determining that the conditioned sensor output signal has reached its peak amplitude, the microcontroller 108 generates a hold signal to place the track-and-hold circuit arrangement 106 in the hold mode, causing the track-and-hold circuit arrangement 106 to hold the amplitude of the output peak indication signal at the peak amplitude. The output of the track-and-hold circuit arrangement 106 is then provided to an analog-to-digital converter (ADC) 110, the output of which is in turn provided to the microcontroller 108. In some embodiments, the ADC 110 may be formed integrally with the microcontroller 108.

In some embodiments, the conditioned sensor output signal has a generally half-sinusoidal waveform, i.e., a waveform resembling a rectified sine wave, when the sensor 102 detects an occupant. The peak amplitude of this type of waveform occurs at 90°, and the waveform is substantially symmetrical about 90°. To capture the conditioned sensor output signal amplitude within 1% of its peak value, for example, the microcontroller 108 calculates a window timing value covering a substantially 16° span between approximately 82° and approximately 98°. This window timing value is appropriate because the amplitude of a pure sinusoid is at 99% of its peak amplitude, i.e., within 1% of its peak amplitude, at 82°:

$$\sin^{-1}(0.99) = 82°$$

Because the waveform is substantially symmetrical about 90°, the amplitude of the waveform is also at approximately 99% of its peak amplitude at approximately 98°. The microcontroller 108 then calculates the window timing value by dividing the substantially 16° span by 360°, the span of a complete cycle of a sinusoid, and multiplying this quotient by the period of the sensor drive signal. If the sensor drive signal has a frequency of 100 KHz (and therefore a period of 0.00001 s), for example, the microcontroller 108 calculates the window timing value as:

$$16° \div 360° \approx 0.0444$$

$$0.0444 \times (0.00001 \text{ s}) = 444 \text{ ns}$$

In operation, the microcontroller 108 is first synchronized to the sensor drive signal by using a timer input capture to detect an edge of the sensor drive signal. This edge occurs when a microcontroller timing signal associated with a first microcontroller timer of the microcontroller 108 has a certain timer value. The microcontroller 108 compensates for the propagation delay of the sensor interface circuit 104 by adding the propagation delay to this timer value. The microcontroller 108 then programs a second microcontroller timer to generate the hold signal when the conditioned sensor output signal is within approximately 1% of its peak amplitude. In particular, the microcontroller 108 programs the second microcontroller to generate the hold signal at a time interval defined by the window timing value, e.g., 444 ns after detecting the peak amplitude in this example.

The resolution with which the microcontroller 108 can cause the track-and-hold circuit arrangement 106 to capture the peak amplitude is a function of the speed of the timer clock associated with the microcontroller 108. For example, if the microcontroller timer clock has a frequency of 25 MHz (and therefore a period of 40 ns) and the sensor drive signal has a frequency of 100 kHz (and a period of 0.00001 s), the resolution is:

$$(40 \text{ ns} \div 0.00001 \text{ s}) \times 360° = 1.4°$$

With this resolution, the theoretical accuracy of the peak detection is:

$$\sin(90° - 1.4°) = 0.9997,$$

that is, within 0.03% of the actual peak value. This level of accuracy represents a substantial improvement over some conventional analog designs in which the demodulator is not controlled by a microcontroller.

Figure 2:
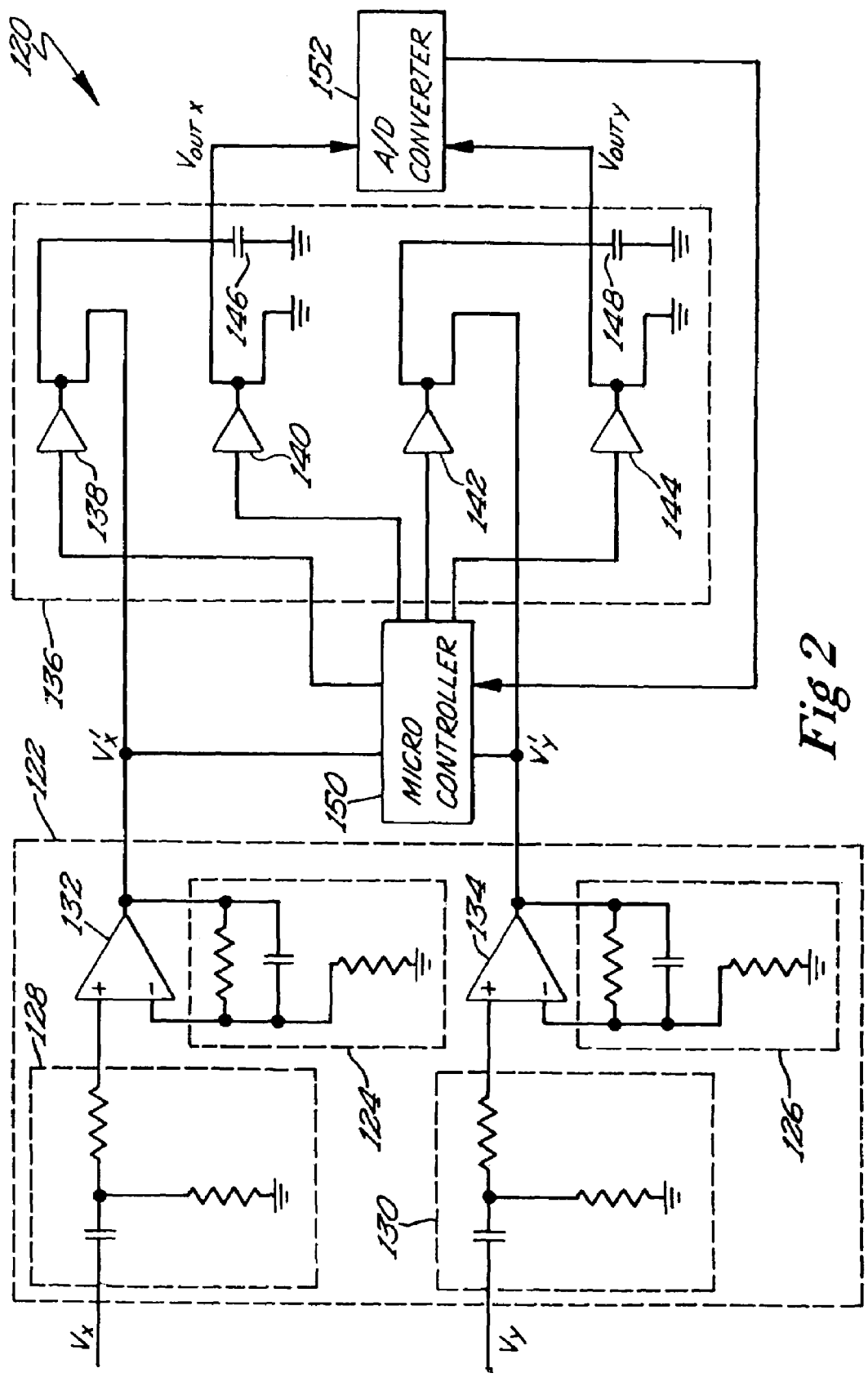
FIG. 2 is a block diagram illustrating an example synchronous demodulation circuit arrangement according to yet another embodiment.

FIG. 2 is a block diagram illustrating an example synchronous demodulation circuit arrangement 120. The synchronous demodulation circuit arrangement 120 receives inputs from one or more sensors (not shown in FIG. 2) for detecting a vehicle occupant. The sensor may be implemented using any of a variety of conventional sensors, including, but not limited to, infrared sensors; optical sensors, ultrasonic sensors, and pressure sensors. The sensor is associated with a sensor drive signal, which is a clock signal. The sensor generates a sensor output signal that indicates whether an object, such as a vehicle occupant, has been detected by the sensor. In the case of an infrared sensor, for example, the sensor generates a sensor output signal indicative of a reflected infrared signal from a remote target. In the particular embodiment illustrated in FIG. 2, the synchronous demodulation circuit arrangement 120 has two input channels, denoted by the symbols $V_x$ and $V_y$, for receiving sensor output signals from two sensors. It will be appreciated by those of ordinary skill in the art that the synchronous demodulation circuit arrangement 120 may incorporate more or fewer input channels.

A sensor interface circuit 122 receives the sensor output signal from the sensor or sensors. The sensor interface circuit 122 includes a number of electronic components for conditioning the sensor output signal. For example, in the particular implementation shown in FIG. 2, the sensor interface circuit 122 includes input bandpass filters 124 and 126 to remove high- and low-frequency noise components from the sensor output signals. Rectifiers 128 and 130 remove negative components of the sensor output signals. Amplifiers 132 and 134 amplify the sensor output signals to facilitate identification of peak amplitudes. The amplifiers 132 and 134 may be implemented, for example, using AD8604 precision CMOS single-supply rail-to-rail input/output wideband operational amplifiers, commercially available from Analog Devices of Norwood, Mass., or comparable components. In certain embodiments, the sensor interface circuit 122 may incorporate additional components. The sensor interface circuit 122 outputs conditioned sensor output signals, denoted by the symbols $V_x'$ and $V_y'$, that facilitate demodulation by the synchronous demodulation circuit arrangement 120. As is well-known in the art, the electronic components of the sensor interface circuit 122 are typically associated with individual propagation delays. Accordingly, the sensor interface circuit 122 as a whole is associated with a propagation delay. In demodulating the conditioned sensor output signal, the synchronous demodulation circuit arrangement 120 compensates for this propagation delay as described in greater detail above in connection with FIG. 1.

A track-and-hold circuit arrangement 136 periodically samples the conditioned sensor output signals $V_x'$ and $V_y'$ from the sensor interface circuit 122. In the embodiment shown in FIG. 2, the track-and-hold circuit arrangement 136 is implemented using four switches 138, 140, 142, and 144. The switches 138, 140, 142, and 144 may be implemented, for example, using ADG412L LC²MOS precision quad SPST switches, commercially available from Analog Devices of Norwood, Mass., or comparable analog MOSFET devices.

The track-and-hold circuit arrangement 136 is operable in a track mode and a hold mode. In the track mode, the switches 138 and 142 are closed, and the outputs of the synchronous demodulation circuit arrangement 120, denoted by the symbols $V_{outx}$ and $V_{outy}$, follow the conditioned sensor output signals $V_x'$ and $V_y'$, respectively. In the hold mode, the switches 138 and 142 are open, and the outputs $V_{outx}$ and $V_{outy}$ are held by hold capacitors 146 and 148, respectively.

A microcontroller 150 controls the operation of the track-and-hold circuit arrangement 136. In particular, the microcontroller 150 places the track-and-hold circuit arrangement 136 in the hold mode so as to capture the conditioned sensor output signal $V_x'$ or $V_y'$ when its amplitude is near its peak value. The track-and-hold circuit arrangement 136 samples the conditioned sensor output signal $V_x'$ or $V_y'$ and indicates the amplitude of the samples to the microcontroller 150. Shortly after determining that the conditioned sensor output signal has reached its peak amplitude, the microcontroller 150 generates a hold signal that opens the switch 138 or 140 and places the track-and-hold circuit arrangement 136 in the hold mode, causing the track-and-hold circuit arrangement 136 to hold the amplitude of the corresponding output $V_{outx}$ or $V_{outy}$ at the peak amplitude. The outputs $V_{outx}$ and $V_{outy}$ are then provided to an analog-to-digital converter (ADC) 152, the output of which is in turn provided to the microcontroller 150. In some embodiments, the ADC 152 may be formed integrally with the microcontroller 150.

In some embodiments, the conditioned sensor output signal $V_x'$ or $V_y'$ has a generally half-sinusoidal waveform, i.e., a waveform resembling a rectified sine wave, when the sensor detects an occupant. The peak amplitude of this type of waveform occurs at 90°, and the waveform is substantially symmetrical about 90°. To capture the conditioned sensor output signal amplitude within 1% of its peak value, for example, the microcontroller 150 calculates a window timing value covering a substantially 16° span between approximately 82° and approximately 98°, as described above in connection with FIG. 1. The microcontroller 150 then calculates the window timing value by dividing the substantially 16° span by 360°, the span of a complete cycle of a sinusoid, and multiplying this quotient by the period of the sensor drive signal. If the sensor drive signal has a frequency of 100 KHz (and therefore a period of 0.00001 s), for example, the window timing value is:

$$16° \div 360° \approx 0.0444$$

$$0.0444 \times (0.00001 \text{ s}) = 444 \text{ ns}$$

In operation, the microcontroller 150 is first synchronized to a sensor drive signal by using a timer input capture to detect an edge of the sensor drive signal. This edge occurs when a microcontroller timing signal associated with a first microcontroller timer of the microcontroller 150 has a certain timer value. The microcontroller 150 compensates for the propagation delay of the sensor interface circuit 104 by adding the propagation delay to this timer value. The microcontroller 150 may store this compensation factor in a non-volatile memory associated with the microcontroller 150 for use based on a temperature/feature algorithm. The microcontroller 150 then programs a second microcontroller timer to generate the hold signal when the conditioned sensor output signal is within approximately 1% of its peak amplitude. In particular, the microcontroller 150 programs the second microcontroller to generate the hold signal at a time interval defined by the window timing value, e.g., 444 ns after detecting the peak amplitude in this example.

In some embodiments, the microcontroller 150 can also null out offset voltages. In particular, the microcontroller 150 can apply a control signal to the switch 140 or 144 to cause the switch 140 or 144 to close. When the switch 140 or 144 closes, the corresponding output $V_{outx}$ or $V_{outy}$ is pulled to ground. In the embodiment shown in FIG. 2, this null function is implemented at the hold capacitors 146 and 148. However, it will be appreciated that the null function can be implemented at other locations, such as the filters 124 and 126.

The resolution with which the microcontroller 150 can cause the track-and-hold circuit arrangement 136 to capture the peak amplitude is a function of the speed of the timer clock associated with the microcontroller 150. As described above in connection FIG. 1, for example, if the microcontroller timer clock has a frequency of 25 MHz and the sensor drive signal has a frequency of 100 kHz, the track-and-hold circuit arrangement 136 can theoretically capture the peak amplitude within 0.03% of the actual peak value. This level of accuracy represents a substantial improvement over some conventional designs.

Further, because the microcontroller 150 controls the timing of the track-and-hold circuit arrangement 136, the microcontroller 150 can self-calibrate the synchronous demodulation circuit arrangement 120 by taking contiguous samples at a given timing interval from the sensor drive clock signal edge and finding the peak value of the input signal. In this mode of operation, the microcontroller 150 can compensate for system to system variations, including individual component tolerances, as well as temperature related variations inherent to most electronic devices. In this way, normal operation accuracy may be enhanced. Additionally, at the early manufacturing test and calibration stages of production, this mode can be used to verify product performance.

Figure 3:
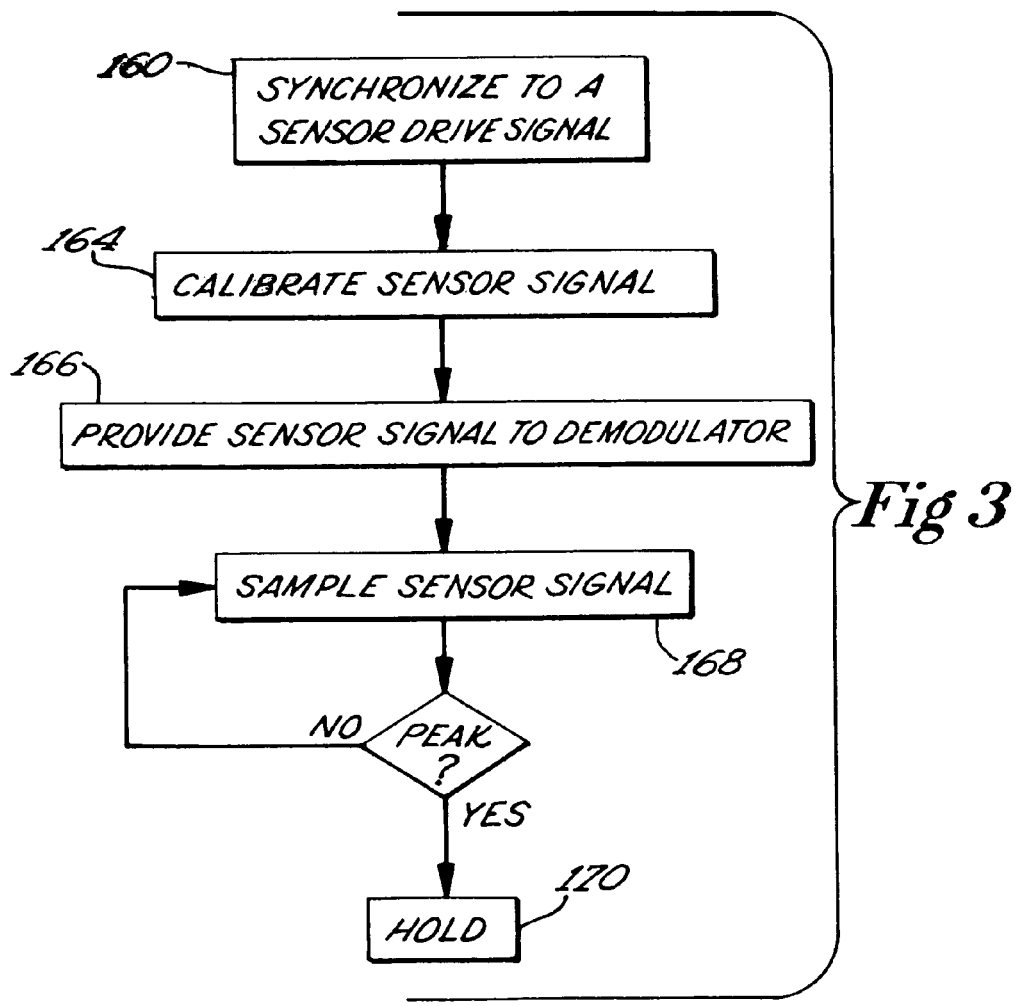
FIG. 3 is a flowchart illustrating an example method detect a vehicle occupant according to another embodiment.

FIG. 3 is a flowchart illustrating an example method to detect a vehicle occupant. This method may be implemented via a microcontroller-readable medium, such as a memory, storing microcontroller-executable instructions. The microcontroller is first synchronized to a sensor drive signal (160) by using a timer input capture to detect an edge of the sensor drive signal. This edge occurs when a microcontroller timing signal associated with a first microcontroller timer of the microcontroller has a certain timer value. The microcontroller compensates for the propagation delay of the sensor interface circuit by adding the propagation delay to this timer value. The microcontroller may store this compensation factor in a non-volatile memory associated with the microcontroller for use based on a temperature/feature algorithm.

A sensor generates a sensor signal (164) in response to sensing a vehicle occupant. The sensor may be implemented using any of a variety of conventional sensors, including, but not limited to, infrared sensors, linear variable differential transformers, optical sensors, ultrasonic sensors, and pressure sensors. A sensor interface circuit then provides a conditioned sensor signal to a synchronous demodulation circuit arrangement (166).

A track-and-hold circuit arrangement periodically samples the conditioned sensor output signals from the sensor interface circuit (168). The samples are evaluated by the microcontroller. If the microcontroller determines that a sample does not represent a peak amplitude, the track-and-hold circuit arrangement again samples the sensor signal (168), and the output of the track-and-hold circuit arrangement tracks the conditioned sensor signal. On the other hand, if the microcontroller determines that the sample represents a peak amplitude, the microcontroller places the track-and-hold circuit arrangement in a hold mode (170) so as to capture the conditioned sensor signal when its amplitude is near its peak amplitude. In particular, the microcontroller programs a microcontroller timer to generate a hold signal when the conditioned sensor output signal is within approximately 1% of its peak amplitude. The track-and-hold circuit arrangement then holds the amplitude of the output at the peak amplitude.

In some embodiments, the compensation for the propagation delay is achieved by assuming that the signal amplitude is constant over several contiguous cycles of the received sensor signal. Accordingly, the sample time can be varied slightly earlier or later than the initial sample time such that the peak of the sample ensemble indicates the correct sample time, thereby compensating for the propagation delay. Once the propagation delay has been established, it need not be adjusted until a significant change, e.g., in ambient temperature, has occurred. The track-and-hold circuit can then be operated in a normal mode in which the output amplitude of the track-and-hold circuit arrangement indicates the position of the occupant.

As demonstrated by the foregoing discussion, various embodiments may provide certain advantages. For instance, the number of components needed to implement synchronous demodulation may be reduced, thereby reducing costs. In particular, the analog peak followers and difference amplifiers present in some conventional designs may be eliminated. Further, with the accuracy of the peak detection determined by the microcontroller clock frequency and the synchronization of the microcontroller to the analog input signals, digital control may enhance the accuracy of the peak detection. In addition, with the microcontroller timer outputs used to control the track-and-hold circuit arrangement, analog-to-digital conversion can take place at a slower clock rate after the signal has been captured by the track-and-hold circuit arrangement.

It will be understood by those skilled in the art that various modifications and improvements may be made without departing from the spirit and scope of the disclosed embodiments. The scope of protection afforded is to be determined solely by the claims and by the breadth of interpretation allowed by law.

What is claimed is:

1. A synchronous demodulation circuit arrangement comprising:
   a sensor interface circuit coupled to receive a sensor signal, the sensor interface circuit associated with a propagation delay;
   a microcontroller configured to generate a microcontroller timing signal and to adjust timing of the microcontroller timing signal as a function of the propagation delay; and
   a track-and-hold circuit arrangement coupled to receive the sensor signal and responsive to the microcontroller timing signal, the track-and-hold circuit arrangement configured to periodically sample the sensor signal;
   wherein the microcontroller is configured to detect a peak amplitude of the sensor signal and generate a hold control signal in response to the detected peak amplitude and the track-and-hold circuit arrangement is configured to output a peak indication signal in response to the hold control signal.

2. The synchronous demodulation circuit arrangement of claim 1, wherein the sensor interface circuit is configured to process the sensor signal before the sensor signal is sampled by the track-and-hold circuit arrangement.

3. The synchronous demodulation circuit arrangement of claim 1, wherein the sensor interface circuit comprises at least one of a rectifier arrangement, an amplifier, and a bandpass filter.

4. The synchronous demodulation circuit arrangement of claim 1, wherein the track-and-hold circuit arrangement comprises a plurality of switches.

5. The synchronous demodulation circuit arrangement of claim 4, wherein the switches comprise MOSFET analog switches.

6. The synchronous demodulation circuit arrangement of claim 4, wherein the track-and-hold circuit arrangement further comprises a hold capacitor.

7. The synchronous demodulation circuit arrangement of claim 1, wherein the microcontroller is configured to
   command the track-and-hold circuit to sample a sensor drive clock signal at predetermined time intervals;
   detect a peak amplitude of the sensor drive clock signal; and
   adjust timing of the microcontroller timing signal in response to detecting the peak amplitude of the sensor drive clock signal.

8. The synchronous demodulation circuit arrangement of claim 1, wherein the microcontroller comprises a memory configured to store data for adjusting the timing of the microcontroller timing signal.

9. An occupant detection system comprising:
   a sensor configured to generate a sensor signal in response to sensing a vehicle occupant;
   a sensor interface circuit coupled to receive the sensor signal, the sensor interface circuit associated with a propagation delay;
   a microcontroller configured to generate a microcontroller timing signal and to adjust timing of the microcontroller timing signal as a function of the propagation delay; and
   a track-and-hold circuit arrangement coupled to receive the sensor signal and responsive to the microcontroller timing signal, the track-and-hold circuit arrangement configured to periodically sample the sensor signal;
   wherein the microcontroller is configured to detect a peak amplitude of the sensor signal and generate a hold control signal in response to the detected peak amplitude and the track-and-hold circuit arrangement is configured to output a peak indication signal in response to the hold control signal.

10. The occupant detection system of claim 9, wherein the sensor interface circuit is configured to process the sensor signal before the sensor signal is sampled by the track-and-hold circuit arrangement.

11. The occupant detection system of claim 9, wherein the sensor interface circuit comprises at least one of a rectifier arrangement, an amplifier, and a bandpass filter.

12. The occupant detection system of claim 9, wherein the track-and-hold circuit arrangement comprises a plurality of MOSFET analog switches.

13. The occupant detection system of claim 12, wherein the track-and-hold circuit arrangement further comprises a hold capacitor.

14. The occupant detection system of claim 9, wherein the microcontroller is configured to:
   command the track-and-hold circuit to sample a sensor drive clock signal at predetermined time intervals;
   detect a peak amplitude of the sensor drive clock signal; and adjust timing of the microcontroller timing signal in response to detecting the peak amplitude of the sensor drive clock signal.

15. The occupant detection system of claim 9, wherein the microcontroller comprises a memory configured to store data for adjusting the timing of the microcontroller timing signal.

16. The occupant detection system of claim 9, wherein the sensor signal comprises an alternating current signal.

17. The occupant detection system of claim 9, wherein the sensor comprises at least one of an infrared sensor and a linear variable differential transformer.

18. A method to demodulate a signal received via an interface circuit, the method comprising:
   synchronizing a microcontroller to a drive signal at least in part by detecting an edge of the drive signal;
   adjusting a microcontroller timing signal as a function of a propagation delay of the interface circuit;
   detecting a peak amplitude of the signal received via the interface circuit;
   in response to detecting the peak amplitude, generating a hold control signal as a function of the adjusted microcontroller timing signal; and
   generating a peak indication signal in response to the hold control signal.

19. The method of claim 18, wherein the hold control signal is generated while an amplitude of the signal received via the interface circuit is within 1% of the peak amplitude.

20. The method of claim 18, further comprising compensating for an offset voltage.

21. The method of claim 18, further comprising:
   sampling a drive clock signal at predetermined time intervals;
   detecting a peak amplitude of the drive clock signal; and
   adjusting the microcontroller timing signal in response to detecting the peak amplitude of the drive clock signal.

22. A method to detect a vehicle occupant, the method comprising:
   generating a sensor signal in response to sensing a vehicle occupant;
   providing the sensor signal to a demodulation circuit arrangement via an interface circuit;
   synchronizing a microcontroller to a sensor drive signal at least in part by detecting an edge of the sensor drive signal;
   adjusting a microcontroller timing signal as a function of a propagation delay of the interface circuit;
   detecting a peak amplitude of the sensor signal;
   in response to detecting the peak amplitude, generating a hold control signal as a function of the adjusted microcontroller timing signal; and
   generating a peak indication signal in response to the hold control signal.

23. The method of claim 22, wherein the hold control signal is generated while an amplitude of the sensor signal is within 1% of the peak amplitude of the sensor signal.

24. The method of claim 22, further comprising compensating for an offset voltage.

25. The method of claim 22, further comprising:
   sampling a sensor drive clock signal at predetermined time intervals;
   detecting a peak amplitude of the sensor drive clock signal; and
   adjusting the microcontroller timing signal in response to detecting the peak amplitude of the sensor drive clock signal.

26. The method of claim 22, wherein the sensor signal comprises an alternating current signal.

27. The method of claim 22, wherein the sensor signal is generated by an infrared sensor.

28. The method of claim 22, wherein the sensor signal is generated by a sensor comprising a linear variable differential transformer.

29. A microcontroller-readable medium having microcontroller-executable instructions that, when executed by a microcontroller, cause the microcontroller to:
   synchronize the microcontroller to a drive signal at least in part by detecting an edge of the drive signal;
   adjust a microcontroller timing signal as a function of a propagation delay of an interface circuit;
   detect a peak amplitude of a signal received via the interface circuit; and
   in response to detecting the peak amplitude, generate a hold control signal as a function of the adjusted microcontroller timing signal.

30. The microcontroller-readable medium of claim 29, wherein the hold control signal is generated while an amplitude of the signal received via the interface circuit is within 1% of the peak amplitude.

31. The microcontroller-readable medium of claim 29, further having microcontroller-executable instructions that, when executed by the microcontroller, cause the microcontroller to generate a null control signal.

32. The microcontroller-readable medium of claim 29, further having microcontroller-executable instructions that, when executed by the microcontroller, cause the microcontroller to:
   sample a drive clock signal at predetermined time intervals;
   detect a peak amplitude of the drive clock signal; and
   adjust the microcontroller timing signal in response to detecting the peak amplitude of the drive clock signal.

* * * * *